(12) United States Patent
Vergöhl et al.

(10) Patent No.: US 12,217,947 B2
(45) Date of Patent: Feb. 4, 2025

(54) METHOD AND DEVICE FOR PRODUCING UNIFORM FILMS ON MOVING SUBSTRATES AND FILMS PRODUCED IN THIS WAY

(71) Applicant: FRAUNHOFER-GESELLSCHAFT ZUR FÖRDERUNG DER ANGEWANDTEN FORSCHUNG E.V., Munich (DE)

(72) Inventors: Michael Vergöhl, Cremlingen (DE); Daniel Rademacher, Braunschweig (DE); Tobias Zickenrott, Braunschweig (DE)

(73) Assignee: Fraunhofer-Gesellschaft zur förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/029,536

(22) PCT Filed: Oct. 16, 2014

(86) PCT No.: PCT/EP2014/072257
§ 371 (c)(1),
(2) Date: Apr. 14, 2016

(87) PCT Pub. No.: WO2015/055781
PCT Pub. Date: Apr. 23, 2015

(65) Prior Publication Data
US 2016/0254127 A1 Sep. 1, 2016

(30) Foreign Application Priority Data
Oct. 16, 2013 (DE) ...................... 10 2013 221 029.9

(51) Int. Cl.
C23C 14/34 (2006.01)
C23C 14/00 (2006.01)
(Continued)

(52) U.S. Cl.
CPC ...... *H01J 37/3405* (2013.01); *C23C 14/0078* (2013.01); *C23C 14/0094* (2013.01);
(Continued)

(58) Field of Classification Search
CPC . C23C 14/0078; C23C 14/0094; C23C 14/08; C23C 14/083; C23C 14/10;
(Continued)

(56) References Cited

U.S. PATENT DOCUMENTS 4,142,958 A * 3/1979 Wei ..................... H01J 37/3053
204/192.11
4,933,063 A * 6/1990 Katsura ............... H01J 37/3447
204/298.03
(Continued)

FOREIGN PATENT DOCUMENTS

CA 2029755 A1 5/1991
DE 690 33 441 T2 5/2000
(Continued)

OTHER PUBLICATIONS

Miyazaki et al. "SiOx filsm prepared using RF magnetron sputtering with a SiO target", Journal of Non-Crystalline Solids 352 (Jan. 2006) pp. 329-333. (Year: 2006).*
(Continued)

*Primary Examiner* — Rodney G McDonald
(74) *Attorney, Agent, or Firm* — Leydig, Voit & Mayer, Ltd.

(57) ABSTRACT

The invention relates to the deposition of optical precision films with high uniformity, precision, particle freedom and low absorption on the substrate. For this purpose, a method and a device are proposed. The approach is the use of target materials and also possibly of surfaces in the sputtering field. Particularly high uniformity and also particularly low residual absorption are achieved with these materials. The
(Continued)

invention is suitable for the production of optical thin-film filters, as are used for example in laser material machining, laser components, optical sensors for measuring technology, or in medical diagnostics.

12 Claims, 7 Drawing Sheets

(51) Int. Cl.
  *C23C 14/08*   (2006.01)
  *C23C 14/10*   (2006.01)
  *C23C 14/14*   (2006.01)
  *C23C 14/35*   (2006.01)
  *G02B 5/20*   (2006.01)
  *G02B 5/28*   (2006.01)
  *H01J 37/32*   (2006.01)
  *H01J 37/34*   (2006.01)

(52) U.S. Cl.
  CPC ............ *C23C 14/08* (2013.01); *C23C 14/083* (2013.01); *C23C 14/10* (2013.01); *C23C 14/14* (2013.01); *C23C 14/35* (2013.01); *G02B 5/20* (2013.01); *G02B 5/285* (2013.01); *H01J 37/32009* (2013.01); *H01J 37/3244* (2013.01); *H01J 37/32761* (2013.01); *H01J 37/3426* (2013.01); *H01J 37/347* (2013.01); *H01J 2237/332* (2013.01)

(58) Field of Classification Search
  CPC .... C23C 14/14; C23C 14/35; H01J 37/32009; H01J 37/3244; H01J 37/32761; H01J 37/3405; H01J 37/3426; H01J 37/347
  USPC ............ 204/298.26, 298.12, 298.13, 298.23, 204/298.28, 298.21, 298.22
  See application file for complete search history.

(56) References Cited

U.S. PATENT DOCUMENTS

| | | | |
|---|---|---|---|
| 5,225,057 A | 7/1993 | Lefebvre et al. | |
| 5,525,199 A | 6/1996 | Scobey | |
| 5,754,297 A * | 5/1998 | Nulman ................ | C23C 14/544 356/630 |
| 5,762,768 A * | 6/1998 | Goy ........................ | C04B 35/01 204/192.29 |
| 5,798,027 A | 8/1998 | Lefebvre et al. | |
| 5,851,365 A | 12/1998 | Scobey | |
| 5,911,856 A * | 6/1999 | Suzuki ................ | C23C 14/0042 204/192.27 |
| 6,103,320 A * | 8/2000 | Matsumoto ......... | C23C 14/0078 204/192.12 |
| 6,573,999 B1 * | 6/2003 | Yang .................. | G01B 11/0625 356/630 |
| 6,761,984 B2 * | 7/2004 | Anzaki .................. | B01J 35/002 106/286.1 |
| 6,863,785 B2 * | 3/2005 | Shidoji ................ | C23C 14/352 204/192.13 |
| 7,182,816 B2 * | 2/2007 | Kleshock .............. | C23C 14/564 204/298.11 |
| 8,956,511 B2 | 2/2015 | Scherer et al. | |
| 2004/0182701 A1 | 9/2004 | Miyamura | |
| 2004/0219789 A1 * | 11/2004 | Wood ................ | H01L 21/67069 257/E21.252 |
| 2005/0051422 A1 * | 3/2005 | Rietzel ............. | H01J 37/32568 204/192.12 |
| 2006/0151312 A1 | 7/2006 | Scherer et al. | |
| 2008/0131693 A1 * | 6/2008 | Hiruma ................ | G02B 5/0858 428/336 |
| 2010/0097607 A1 * | 4/2010 | Susaki ............... | G01B 11/0641 356/369 |
| 2010/0187094 A1 * | 7/2010 | Fukao ................... | C23C 14/546 204/192.1 |
| 2011/0168544 A1 * | 7/2011 | Shiono .............. | H01J 37/32082 427/539 |
| 2012/0164051 A1 * | 6/2012 | Bruns ................. | H01J 37/3467 423/325 |
| 2012/0228122 A1 | 9/2012 | Minami | |
| 2014/0262752 A1 | 9/2014 | Vergöhl et al. | |
| 2015/0162173 A1 | 6/2015 | Scherer et al. | |

FOREIGN PATENT DOCUMENTS

| | | |
|---|---|---|
| DE | 103 47 521 A1 | 6/2004 |
| DE | 10 2004 004569 A1 | 8/2004 |
| EP | 0 409 451 A1 | 1/1991 |
| EP | 2 549 521 A1 | 1/2013 |
| JP | 61-231167 | * 10/1986 |
| JP | 2004-232016 | * 8/2004 |
| JP | 2007-107053 | * 4/2007 |

OTHER PUBLICATIONS

Machine Translation JP 2004-232016 (Year: 2004).*
Machine Translation JP 61-231167 (Year: 1986).*
Machine Translation JP 2007-107053 (Year: 2007).*
"Studies of Yttrium oxide films prepared by rf magnetron sputtering", Electronics Letters, Sep. 29, 1988, vol. 24, No. 20 (Year: 1988).*
Badeen et al: "Advanced optical coatings for telecom and spectroscopic applications," *Proceedings of SPIE*, vol. 7101, p. 71010H (2008).
Jacobsohn et al., "The role of trapped Ar atoms in the mechanical properties of boron carbide films deposited by dc-magnetron sputtering," *J. Vac. Sci. Technol. A* 21(5): 1639-1643 (2003).
Stenzel et al., "Optical and mechanical properties of oxide UV coatings, prepared by PVD techniques," *Proceedings of the SPIE*, p. 816861W (2011).
Vergöhl et al., "Towards ultra-precise optical interference filters on large area: computational and experimental optimization of the homogeneity of magnetron-sputtered precision optical coatings," *Proceedings of SPIE, SPIE—International Society for Optical Engineering*, US, vol. 8450, pp. 84502J-84502J (2012).
Vergöhl et al., "Progress on optical coatings deposited with dual rotatable magnetrons in a sputter up system," *Surface and Coatings Technology*, vol. 241, pp. 38-44 (2014).
Windischmann, "Intrinsic Stress in Sputter-Deposited Thin Films," *Critical Reviews in Solid State and Material Sciences* 17(6): 574-596 (1992).
European Patent Office, International Search Report in International Application No. PCT/EP2014/072257 (Jan. 23, 2015).
European Patent Office, Written Opinion in International Application No. PCT/EP2014/072257 (Jan. 23, 2015).
International Bureau of WIPO, International Preliminary Report on Patentability in International Application No. PCT/EP2014/072257 (Apr. 19, 2016).
Hendrix et al., "Demonstration of narrowband notch and multi-notch filters," *Proceedings of SPIE*, vol. 7067, 706702, (2008).
Schiffmann et al., "Characterization of 31 nonperiodic layers of alternate $SiO_2/Nb_2O_5$ on glass for optical filters by SIMS, XRR, and ellipsometry," *Surf. Interface. Anal.* 45(1): 490-493 (2013).
European Patent Office, Summons to oral proceedings in accordance with Rule 115(1) EPC in European Patent Application No. 14 790 545.9 (Oct. 6, 2023).

* cited by examiner

METHOD AND DEVICE FOR PRODUCING UNIFORM FILMS ON MOVING SUBSTRATES AND FILMS PRODUCED IN THIS WAY

CROSS-REFERENCE TO RELATED APPLICATIONS

This patent application is the U.S. national phase of International Application No. PCT/EP2014/072257, filed on Oct. 16, 2014, which claims the benefit of German Patent Application No. 10 2013 221 029.9, filed Oct. 16, 2013, the disclosures of which are incorporated herein by reference in their entireties for all purposes.

The invention relates to the deposition of optical precision films with high uniformity, precision, particle freedom and low absorption on the substrate. For this purpose, a method and a device are proposed. The approach is the use of target materials and also possibly of surfaces in the sputtering field. Particularly high uniformity and also particularly low residual absorption is achieved with these materials. The invention is suitable for the production of optical thin-film filters, as are used for example in laser material machining, laser components, optical sensors for measuring technology, or in medical diagnostics.

Optical filters are often deposited with a large number of films and the entire film thickness is then above a few micrometres, as far as in part over 10 micrometres or even more. Low losses in the film are then crucial. Both scattering losses and losses due to substoichiometry must be avoided. The method proposed here likewise enables deposition of very low-loss and also defect-free films.

Optical precision filters are a key component in many industrial products of optical technologies. Applications extend from laser technology, via medical- and bioengineering technology, display- and automobile- to the solar industry. As a result of the constantly increasing technological requirements and also due to the increasing competition from low-wage countries, the demand for better, more flexible and simultaneously economical production methods for optical precision coatings is growing. Current methods are increasingly reaching technological limits with particularly high requirements: increasing rejects, too low long-term stability and also the non-achievability of technical specifications reduces the economic efficiency and impedes introduction of new products.

In particular magnetron sputtering sources have proved their worth in the last few years as extremely efficient coating tools for manufacturing thin-film systems on an industrial scale. In particular for optical coatings and the requirements associated therewith for film uniformity and—homogeneity, stoichiometry and particle freedom, targets represent a very good possibility, with an added reactive gas component, of fulfilling the required criteria. By using targets with an incorporated reactive gas component, the stability of the process, which is determined essentially by the getter behaviour of the surfaces and the consequently extending concentration structure of the reactive gas component, can be improved. Precisely in the case of coating concepts which are based on rotary table arrangements, life spans and stability of the coating process can thus be significantly increased.

Optical thin-film systems which use the principle of interference, e.g. for laser technology, medical- and bioengineering technology, display- and automobile technology, of the solar industry as far as space technologies, hereby require the most precise adherence as possible to the specified filter properties and also low absorptions and losses in the optical filter. In order to maintain in particular the required minimum losses, it is absolutely necessary to be able to adjust the stoichiometry of the films in a precise and stable manner since these can be the cause of scattering, absorption and low destruction thresholds in the field of laser applications.

Not only is it necessary to achieve the good properties of the films but also with as large a surface area as possible and with high reproducibility. In the film production, very precisely adjustable film thicknesses are required in particular in precision optics. The film thickness distribution on the substrate requires a particularly stable and well-conditioned process.

As a result of constantly expanding requirements, coating methods are practically always at the limit of what is technically possible. The film properties to be achieved thereby often require mutually contradictory process conditions. Thus a high film hardness and stable coating with a very smooth surface (without temperature dependency of the edges) correlates in general with compressive film stresses, whilst films without stress are generally rough and display a great temperature- and moisture dependency (spectral shift).

The great importance of the correlation of energetic particles (ions, neutral particles, radicals) with the film growth process and hence the film properties was detected early on: the morphology and hence also the film properties in the plasma coating processes are essentially determined by the type and the energy distribution both of ions and of neutral particles, the particle energies of ions and neutral particles being able to vary greatly according to the plasma conditions. Film stresses can be explained, within the scope of the atomic peening model, by the bombardment of the film with energetic particles. Also negatively charged oxygen ions, as occur in particular in reactive processes, can significantly influence the film growth.

For the production of precision-optical films, increasingly magnetron sputtering is used nowadays. With this method, dense, low-absorption films can be produced. Relative to standard methods, such as vapour coating, magnetron sputtering has high process stability. In particular, the process can also be automated, transfer of the samples to be coated being able to be effected via an airlock. The airlock principle makes it possible to achieve particularly high cleanliness of the surface since, in conventional batch plants, ventilation must take place after each batch which leads to the fact that coatings on chamber walls etc. can flake off due to the introduction of moisture. In systems with airlocks, the process chamber can be kept permanently under vacuum, which enables very clean and stable processes.

RF-excited processes in which the power is introduced typically at 13.56 MHz are used. With RF processes, also insulating sputter targets can be used. Nowadays, also pulsed processes are however preferred (with frequencies in the medium frequency range, 10-300 KHz, preferably around 45 KHz). These are more economical and can be scaled up readily. If oxidic compound films are produced using metallic targets, these are called reactive sputtering processes.

Plasmas, based on magnetron discharges, generally consist of more than 99% of non-ionised particles. These can have high energies and therefore contribute greatly to film stresses. They can be influenced indirectly, for example by changing the magnetic field design or by using alternative sputtering gases. Reflected argon particles were recognised as the reason for film stress by Windischmann (Windischmann, H. (1992), "Intrinsic Stress in Sputter-Deposited Thin Films", Critical Reviews in Solid State and Materials Sciences 17(6): 547-596) on AlN films and also on BC films by Jacobssohn (L. G. Jacobssohn, R. D. Averitt and M. Nastasi, "The role of trapped Ar atoms in the mechanical properties of boron carbide films deposited by dc-magnetron sputtering, J. Vac. Sci. Technol. A 21 (5) (2003), p. 1639). Other gases (e.g. the lighter krypton instead of argon) in fact lead to lower stresses but likewise to lower hardnesses.

Also the optical properties are influenced by the particle bombardment of the growing film: in fluoridic films, increased absorption was found due to the incorporation of argon in the film. The possibility of influencing the ion- and neutral particle energies and the density thereof are of great interest for the production and optimisation of optical films. Energetic neutral particles which impinge on the growing film can induce for example Frenkel defects. Nanodefects play an ever greater role in high-power optics for ultrashort pulse- or UV laser applications. In coating processes in which compound films are deposited (metal oxides, nitrides etc.), also defects however are produced as particles, for example by thick parasitic compound films being deposited on surfaces in the plant. These films are often bonded only loosely and can flake off as soon as air with water components reaches the surface or even if the film thickness is too great. In this case, particles which can contaminate the substrate are formed. The magnetron itself is a source of particles, in particular in reactive coating processes.

Reactive sputtering processes have in principle two stable operating areas, the oxide mode and the metallic mode. In the oxide mode, the target is covered with an oxide film and the rate on the substrate is low. The film is transparent (stoichiometric). In the metal mode, the target is metallic, the rate is high and the film is metallic. In order to produce transparent films at a high rate, the reactive sputtering process must be adjusted (controlled) dynamically to an average, specific reactive gas partial pressure, which is possible for example by means of measuring the oxygen partial pressure by means of a lambda sensor or even optically by means of plasma emission measurement. This operating point is termed "transition mode".

The challenges in the field of reactive magnetron sputtering technology reside in the fact that, according to the target material and the production method thereof, different process parameters result, which are suitable for the production of optical precision coatings.

For example, metallic targets are operated in general in the so-called "transition mode". Here the target is situated permanently in a metallic, oxide-free state whilst, in the process room, sufficient oxygen must be present for oxidation of the growing film.

Hence, a combination of stoichiometric films and a high rate can be achieved. This process point can either be stabilised by suitable control, as a result of which the oxygen partial pressure is kept constant. By using double magnetron arrangements with bipolar excitation, in addition also better long-term stability could be ensured on the basis of the "non-disappearing anode" and fairly high plasma densities in combination with denser (but also more greatly stressed) films.

In U.S. Pat. No. 5,525,199, a method for the production of low-particle films with very low losses is presented. There, these properties are achieved by operating the magnetron discharge at a very low process pressure with simultaneously a large spacing between target and substrate. The same applies to the patent U.S. Pat. No. 5,851,365, in which the spacing at 40 cm (16") is always significantly greater than normal which is normally less than 10 cm, preferably between 7 and 9 cm.

When controlling reactive magnetron sputtering processes, a time constant of approx. 20-30 milliseconds is achievable, according to the pump ratios and configuration of the components. The disadvantage of this dynamic stabilisation is that, even with optimum control, low residual variations in the process conditions and hence also in the stoichiometry of the film cannot be avoided which can lead to small inhomogeneities and hence to loss mechanisms, which can cause problems in particular with very high-quality optical films. Effects are also often found in that the sputtering target does not operate symmetrically. On the one side of the target, the latter burns metallically at a high rate whilst, on the other, it operates oxidically at a low rate. Since a target covered with an oxide film has less getter effect for the metal atoms, the reactive gas partial pressure is further increased there.

Since the sputtering yield for oxides is in general less than for metals, the rate drops there. On the metallic side, the opposite mechanism takes place: because of the metallic target there, the getter effect is high so that the oxygen partial pressure becomes lower and the rate increases there. More oxygen is consumed there. Finally the reactive process management leads to the distribution tipping over. In fact, the distribution can be actively controlled by using a plurality of measuring points (in particular optical plasma emission sensors), however this method is limited if an extremely high uniformity of more than approx. 99% to over 99.8% is important since the sensors are then sensitive only to a limited extent.

Therefore, also the approach of sputtering of very thin, substoichiometric or metallic films is pursued, which films are subsequently oxidised separately in an oxygen plasma. The advantage in this methodology likewise resides in the extensively metallic surface of the target. This production method requires plant technology with a separate plasma source and substrate movement in the process. Respectively very thin films (0.1-5 Å effective optical thickness) are thereby oxidised. For this method, in particular, rotary table units are suitable since the stations here for the coating and the station for the subsequent oxidisation can be provided in succession. In DE 103 47521 A1, such a method is described.

Here, firstly substoichiometric films with negligible optical losses are deposited with the addition of a reactive gas component to the sputtered material on a component (e.g. glass) and the plasma source is used for complete oxidation of this film.

In EP 0409451, U.S. Pat. No. 5,225,057, OCLI, "Process for depositing optical films on both planar and non-planar substrates", U.S. Pat. No. 5,798,027 and DE 690 33 441 T2, a metallic coating is implemented with subsequent oxidation in the plasma. A microwave plasma source which can be operated with oxygen (or reactive gas) and a neutral gas (argon) or a mixture thereof is used there.

High separation of the process rooms of oxidation area (plasma source) and magnetron should be given preference in order that the magnetron "sees" no or as little oxygen as possible.

Starting herefrom, it was the object of the present invention to provide a method for the production of uniform films, which enables a stable deposition process at the highest possible throughput.

This object is achieved by the method, the device, the coated substrate and the optical filter, as well as the advantageous developments thereof, which are described herein.

According to the invention, a method for the production of uniform films on moving substrates in a vacuum chamber by deposition of at least one source material by means of magnetron sputtering is provided, in which at least one substrate is transported with at least one movable substrate mounting in the vacuum chamber to at least one sputtering zone and, in the sputtering zone, at least one film made of source material is deposited on the substrate by sputtering the target comprising the source material. The method according to the invention is thereby distinguished by the source material being deposited without separate supply of a reaction gas into the vacuum chamber. Firstly, a thin, substoichiometric film can hereby be deposited, which film can be oxidised through completely in a subsequent step in an oxidation zone.

According to the invention, a substrate is moved to and fro for this purpose in a fast-moving arrangement between coating- and oxidation zone so that respectively only a very thin film of less than 1 nm should preferably be oxidised. The oxidation can be effected by oxygen alone or also by an oxygen plasma source, such as in the above U.S. Pat. No. 5,798,027 (OCLI) patent specification.

Preferably, cylindrical sputtering targets which remain particularly clean are used since they leave behind no rear coating regions on the target. In particular in reactive coating processes (with e.g. oxygen or nitrogen as reactive gas), such rear-coating regions made of metal oxides (or -nitrides) which represent a source for particles are formed on planar cathodes. Therefore, the use of cylindrical targets enables a very clean coating process. Optionally, a single or even a double magnetron can be used. Preferably, a pulsed sputtering process should be used.

In contrast to the state of the art, no additional gaseous reactive component is added in the process room in the approach according to the invention.

The sputtering target preferably consists of a target which already comprises substantial quantities of the reactive gas. A ceramic material of the form $MeO_x$ is conceivable here as source material. If the film in the form $MeO_2$ with Me=Ti, Si, Zr, Hf is stoichiometric, then the composition $MeO_x$ with x=0.5 to 2 can be applied hereby to the target, preferably with x as high as possible, the target being intended to have however an electrical conductivity. The same applies to films of the form $Me_2O_3$ in the case of aluminium or $Me_2O_5$ in the case of tantalum or niobium. A high electrical conductivity is required in order to avoid electrical arc discharges and to enable a stable sputtering operation of the target. It can be sensible here that the target is not fully stoichiometric but metallic components for the oxide are used. Production of the target can take place for example by thermal injection where, by addition of metallic powder to the oxide powder, electrical conductivity of the target is achieved so that the sputtering process can be operated also with DC or average frequency excitation.

The reactive gas component can be incorporated already in the source material (e.g. $Nb_2O_x$, $Ta_2O_x$, $TiO_x$, $HfO_x$, $ZrO_x$ etc.) and leads in fact, during the deposition of the film on the component, to the formation of a substoichiometric film.

This film can now be produced in a particularly stable manner since the sputtering cathode consists uniformly of the same material and the surface, since the same material is also always sputtered in constant composition, always has the same stoichiometry. This leads to a particularly stable sputtering yield and hence coating rate over the target. In the case of a metallic cathode, the danger exists that asymmetry of the covering with a (sub-) oxide film is formed. This is because as soon as an oxide film is formed on one target side, the sputtering rate there is reduced so that the oxygen proportion there increases even more. Hence, this reduces in addition the coating rate, which can lead to ever greater asymmetry of the discharge.

In fact, this effect is reduced, even with metallic targets, if the process is operated partially reactively, i.e. a plasma source assists the subsequent oxidation so that then the reactive gas content can be reduced relative to a fully reactive process. However, in particular in the field of very high precision and uniformity (>99%), asymmetry is possible because the sputtering rate is more greatly dependent upon the oxide coating. The distribution can then tip over, which is represented in FIG. 4.

However, it was found surprisingly that, with a source material comprising a metal oxide or semimetal oxide, with which metal or semimetal is mixed, substantially higher deposition rates can be achieved, the properties of the sputtered film being of equal quality (e.g. the same optical quality). Consequently, the use of this "mixed source material" makes the entire process significantly more economical.

It is therefore preferred that, in the method according to the invention or in the device according to the invention, the at least one source material comprises a mixture of i) a metal and metal oxide; or
    ii) a semimetal and semimetal oxide; or
    iii) metallic microcrystallites and oxidic, nitridic or fluoridic microcrystallites, or consists thereof, the composition preferably comprising $MeO_{2-x}$, $Me_2O_{3-y}$ or $Me_2O_{5-z}$ with Me=Ti, Zr, Nb, Hf, Si, Al, Sn, In, Y and/or mixtures thereof or consisting thereof, starting from the full stoichiometry, the value x being between 0.5 and 1.5, the value y being between 0.5 and 1.5 and the value z being between 0.5 and 2.5, for particular preference the value x being between 0.75 and 1.25, the value y being between 0.75 and 1.25 and the value z being between 1 and 2.

In order to obtain a favourable combination of high rate and optimum optical properties (low absorption, low scattering), the metal proportion in the target is enough that, starting from the full stoichiometry ($MeO_{2-x}$, $Me_2O_{3-y}$ or $Me_2O_{5-z}$), the value x is ideally between 0.5 and 1.5, the value y is between 0.5 and 1.5 and the value z is between 0.5 and 2.5. For particular preference, the value x is between 0.75 and 1.25, the value y between 0.75 and 1.25 and the value z between 1 and 2.

In the case of cylindrical targets, this advantage is particularly great because these have a significantly larger surface area than planar targets. The getter effect is therefore greater than with cylindrical targets.

In a preferred embodiment, at least one plasma source is used in the device according to the invention in order to oxidise, nitride and/or fluorinate the at least one film made of at least one source material on the substrate, preferably with a gas comprising or consisting of oxygen, nitrogen and/or fluorine-containing gas, particularly preferably such that substoichiometrically oxidised, nitrided and/or fluorinated material of the at least one film made of at least one source material on the substrate is oxidised, nitrided and/or fluorinated to form stoichiometrically oxidised, nitrided and/or fluorinated material.

According to the invention, a higher coating rate can also be achieved for the production of optical films with low absorption losses. In fact, a higher rate can be achieved with cylindrical, metallic targets than with a reactive gas-containing target since the sputtering yield is generally higher. In this case, the rate must however be chosen to be so small that the plasma subsequent oxidisation is still able to oxidise the film completely. However, optical absorption losses are also possible at a low rate even in this case. At too a high rate, the metallic films are too thick to be able to be oxidised through. Hence transparent films can only be produced at a low rate in the process. In the process according to the invention, in fact an oxide film with a stoichiometry nearly that of the target is deposited with high stability so that even fairly thick partial films can be oxidised through.

By the use according to the invention of a target comprising the source material, the cathode remains furthermore clean and no rear coating regions are formed.

The thus produced, substoichiometric film is subsequently oxidised at the plasma source. Hence the rate or the speed of rotation of the substrate must be adjusted such that only a thin film (1 to 10 atomic layers) need be oxidised.

In optics, generally in addition to high-refractive materials ($TiO_2$, $Ta_2O_5$, $CeO_2$, $Y_2O_3$, $Nb_2O_5$ etc.), also low-refractive materials are used. These are in general $SiO_2$ or in part also $Al_2O_3$.

The possibility exists that a target of the form $SiO_x$ is not sufficiently conductive to be used with medium frequency technology (up to 300 KHz). Instead of this, also an RF process (13.56 MHz) can be used. RF technology is also usable for pure $SiO_2$ targets (quartz tubes) which can then be sputtered almost fully stoichiometrically. By means of plasma subsequent oxidation, optical losses can be further reduced. This variant would have particular advantages for demanding laser components (laser mirrors) in which high laser powers are used.

Also fluoride films can be produced particularly favourably with this method by a fluoride target being sputtered by means of RF and a plasma fluorine treatment being implemented with a $CF_4$ gas. $CF_4$ is less demanding than pure fluorine gas from a technical safety point of view. With this $CF_4$, also very low-loss films can then also be produced.

On the other hand, the results have also shown that, in particular in the case of high-refractive materials, advantageous results can be achieved by the present invention.

One approach for increasing the conductivity of $SiO_x$ targets exists however also in doping other materials into the target so that the latter is again conductive. Such materials, which are in turn transparent and conductive as oxide, e.g. Ta, Nb, Al, boron, Sn or Zn, are conceivable. This method can also be used with other target materials.

For example also the possibility that fully stoichiometric targets are doped is conceivable so that in fact no metallic components are present in the target, nevertheless electrical conductivity results however and the advantages of particularly high stability and uniformity can be exploited. In this case, particularly good stoichiometry of the films results, since in fact the film can be deposited almost stoichiometrically even without an additional plasma source. With a subsequent plasma oxidation, the stoichiometry can be achieved particularly well, which has particular advantages for very demanding optics, such as laser components in which very small optical losses are important.

The residual conductivity can be measured for example with an ohmmeter at a broken edge.

According to the invention, it is preferred if not only the target consists of the source material but also individual or all surfaces which are situated in the region of the sputtering zone (i.e. in the compartment). Also metallic parts can be provided with a coating comprising the source material so that the surface does not exert a getter effect for the reactive gas. There are included herein, in particular apertures which are disposed in the region of the sputtering zone, e.g. the Schäfer aperture.

A preferred variant provides that the source material comprises a reactive gas from the group consisting of oxygen, nitrogen and/or fluorine, which is released preferably during sputtering "in situ" in the vacuum chamber.

In fact, in the case of a ceramic, reactive gas-containing target, the influence of the reactive gas partial pressure on the rate is less than in the case of a metallic target, however, an influence, even if small, can be established here also if in, or in the vicinity, of the sputtering region, components are situated which can getter oxygen. According to the getter effect of the components, this can indeed lead to the fact that individual partial regions getter the reactive gas differently so that the result can be variations in the oxygen partial pressure. These in turn influence slightly the rate on the target. Asymmetries can result here if e.g. metallic parts with a high getter effect are situated at one end of the target.

According to the invention, it is proposed also therefore, in addition to the use of targets comprising source material, that all surfaces in the sputtering compartment consist of the source material or are provided with a surface comprising the source material, in particular those components which are situated close to the sputtering target. These are for example screening metal sheets or correction apertures which are used with rotary table units in order to correct the film thickness distribution on the substrate. By using these components and also the reactive gas-containing target, it is possible to minimise a drift in the film thickness distribution and to achieve a very stable and high uniformity of better than 99%, preferably better than 99.5%, particularly preferably better than 99.8%, on the entire substrate and on all substrates of the batch (see FIG. 5). This uniformity can be measured with the help of a plurality of optical sensors, which measure for example the transmission as a function of the wavelength, from which the film thickness at various places of the substrate is calculated.

In the case of rotary table arrangements with rapid rotation (50-500 rotations per minute), a substrate size between 100 and 400 mm, preferably 150-300 mm, particularly preferably 180-250 mm, has proved its worth.

Whilst in conventional constructions with metallic surfaces, conditioning must take place in part for a long time, i.e. coating over several hours with film thicknesses of several 1,000 nm film thickness on the substrate, a short conditioning can be adequate with the correct choice of surfaces (less than 1,000 nm deposited film).

It is advantageous here also to ensure, by conditioning, a constant temperature of all surfaces because varying temperatures lead to locally different getter effect of the surfaces or to varied reactive gas partial pressure. Ideally, all parts should therefore be at the same temperature.

Here also, the use of targets comprising source material and/or components comprising source material in the process chamber leads to rapid conditioning being achieved. Here also, good conditioning can be measured via measurement of the uniformity by means of a transmission monitor. Thus the duration of the conditioning which is approx. 10 h according to the method of the state of the art, can be reduced to 1 to 2 h in the method according to the invention.

A further preferred embodiment provides that at least one plasma source is used for tempering the substrate, for cleaning the substrate, in particular by decomposition of organic contamination on the substrate, for activating the surface of the substrate, for modifying the structure and/or stoichiometry of the film and/or for adjusting the intrinsic stress of the film.

Modification of the stoichiometry of the film is required when substoichiometric films are deposited during sputtering, e.g. a film of $TiO_{1.9}$, which must be oxidised subsequently by means of a plasma source in order to obtain the desired stoichiometry, e.g. $TiO_2$.

Preferably, the process pressure in the vacuum chamber is from $3\times10^{-4}$ to $5\times10^{-2}$ mb.

The magnetron sputtering can be operated with a direct current supply (DC), a pulsed direct current supply by high-power impulse magnetron sputtering (HIPIMS) or by medium frequency- or RF discharges.

A further variant according to the invention provides that the thickness of the film on the substrate is controlled by one of the following measurements:

optical transmission monitoring, optionally via polarised transmission measurements at an acute angle of incidence, optical reflection monitoring, optionally via polarised reflection measurements at an acute angle of incidence, optical absorption monitoring, ellipsometry at a wavelength or over a spectral range and also oscillator quartz measurement.

According to the invention, a device for the production of uniform films on moving substrates in a vacuum by deposition of at least one source material by means of magnetron sputtering is likewise provided, which comprises a vacuum chamber with at least one sputtering zone, in which at least one magnetron sputtering device with at least one target comprising the source material is disposed, at least one movable substrate mounting for transport of at least one substrate to the at least one sputtering zone being disposed in the vacuum chamber. The source material according to the invention is a material which does not require separate supply of a reaction gas into the vacuum chamber.

According to the invention, it is preferred that, in the sputtering zone, in order to shorten the conditioning phase, at least one surface is provided with a coating comprising the source material or consists of the source material. Thus it is possible for example that, in the sputtering zone, further components, in particular metal sheets, are used, of which at least some of these components are provided with a coating comprising the source material or consist of the source material. With respect to the materials, reference is made to the source materials made of materials comprising oxygen-nitrogen and/or fluorine which were mentioned in the previously described method.

The device according to the invention can be characterised in that it comprises at least one plasma source, preferably in the vacuum chamber, the plasma source being equipped and adjusted such that the plasma source oxidises, nitrides and/or fluorinates at least one film made of at least one source material on the substrate, preferably with a gas comprising or consisting of oxygen, nitrogen and/or a fluorine-containing gas, particularly preferably such that substoichiometrically oxidised, nitrided and/or fluorinated material of the at least one film made of at least one source material on the substrate is oxidised, nitrided and/or fluorinated to form stoichiometrically oxidised, nitrided and/or fluorinated material.

According to the invention, a coated substrate is likewise provided which is producible according to the previously described method.

The substrates deposited according to the invention preferably have a uniformity of at least 99.9%, preferably of at least 99.5% and particularly preferably of at least 99.8%.

Determining the uniformity was thereby effected according to the following methodology:

the mechanical film stress is measured by an optical technique. For this purpose, coated $100\times10$ mm$^2$ sized glass substrates (Schott D263T) with a thickness of 0.1 mm are deposited on two razor blades at a defined spacing. With a laser distance meter (MICRO-EPSILON optoNCDT ILD1400 series), the curvature of the sheets of glass is measured via triangulation. Each sample is laid down and measured 5 times in order to reduce the measuring error. In order to reduce the effect of gravity on the measurement, both sides of the sample are measured.

This measuring method is described in more detail in "Stenzel, Olaf, Mark Schürmann, Steffen Wilbrandt, Norbert Kaiser, Andreas Tünnermann, Mathias Mende, Henrik Ehlers, Detlev Ristau, Stefan Bruns, Michael Vergöhl, Werner Riggers, Martin Bischoff and Mario Held: Optical and mechanical properties of oxide UV coatings, prepared by PVD techniques. Proceedings of the SPIE, page 816861W, 2011."

Furthermore, it is preferred that the substrate consists of a material thermally stable up to 100° C., in particular up to 80° C., in particular a plastic material.

Furthermore, an optical filter consisting of a sequence of at least two alternating films is provided, the at least two alternating films having a different composition and being producible according to the method according to the invention. In particular, the optical filter has at least 120 alternating films and/or a total thickness of at least 6 μm. The at least two alternating films can comprise two alternating substrates according to the invention (i.e. two films according to the invention with a different composition) or consist thereof.

The subject according to the invention is intended to be explained in more detail with reference to the subsequent Figures without wishing to restrict said subject to the specific embodiments shown here.

Figure 1:
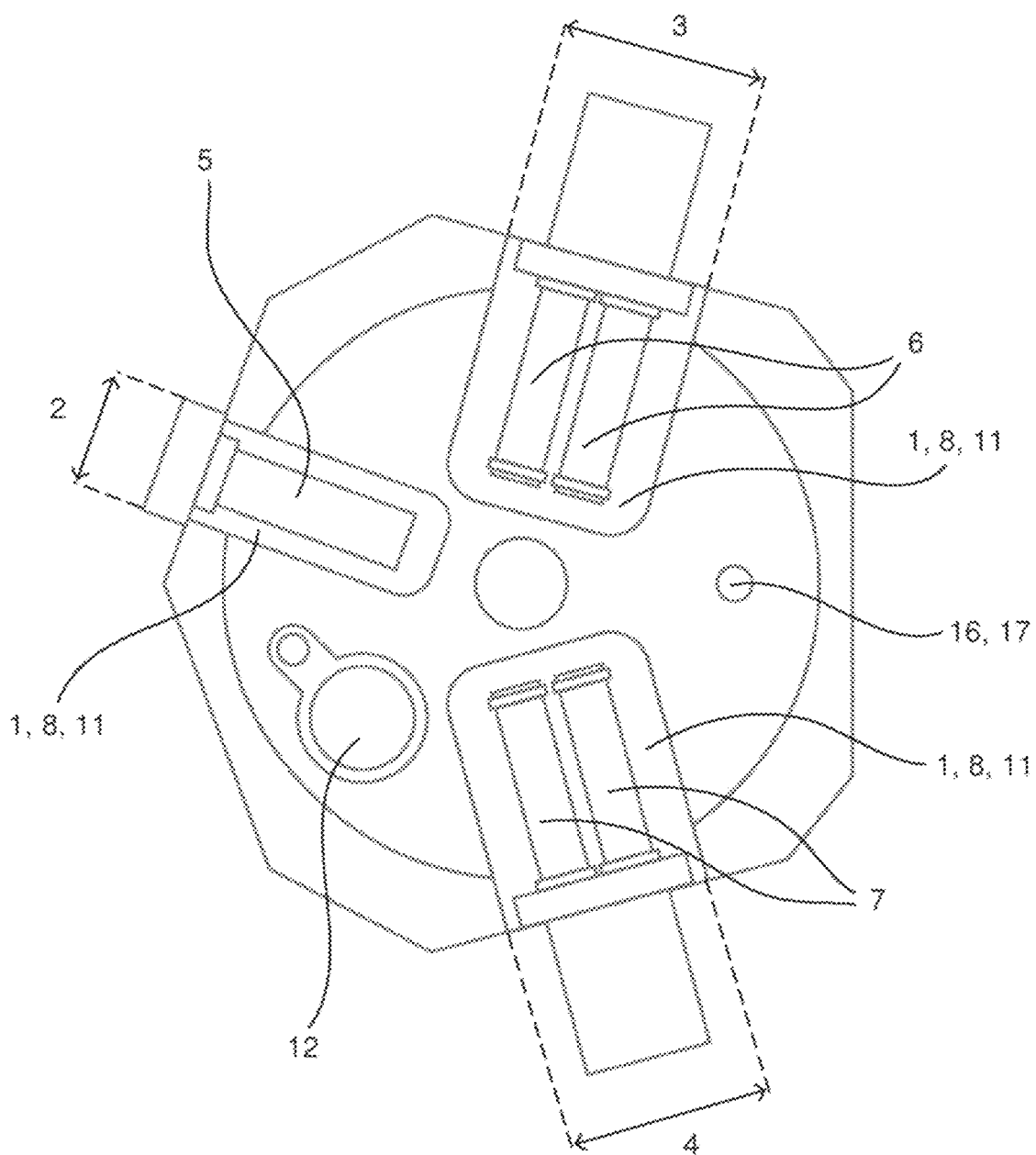
FIG. 1 shows a schematic illustration of a preferred device according to the invention without a rotary table in plan view.

FIG. 1 shows schematically in plan view a preferred device according to the invention without rotary table. The device has three magnetron sputtering devices 2, 3, 4, one of which is configured in the single magnetron arrangement 2 and two in the double magnetron arrangement 3, 4. The magnetron sputtering devices 2 comprise a magnetron electrode 5 and sputtering gas 11 and are situated in a vacuum 1. The magnetron sputtering devices 3, 4 comprise respectively two magnetron electrodes 6, 7 and sputtering gas 11 and are situated in a vacuum 1. In the vicinity of the magnetron sputtering devices 2, 3, 4, a plasma source 12 and a photometer 16 and/or an ellipsometry flange 17 are situated.

Figure 2:
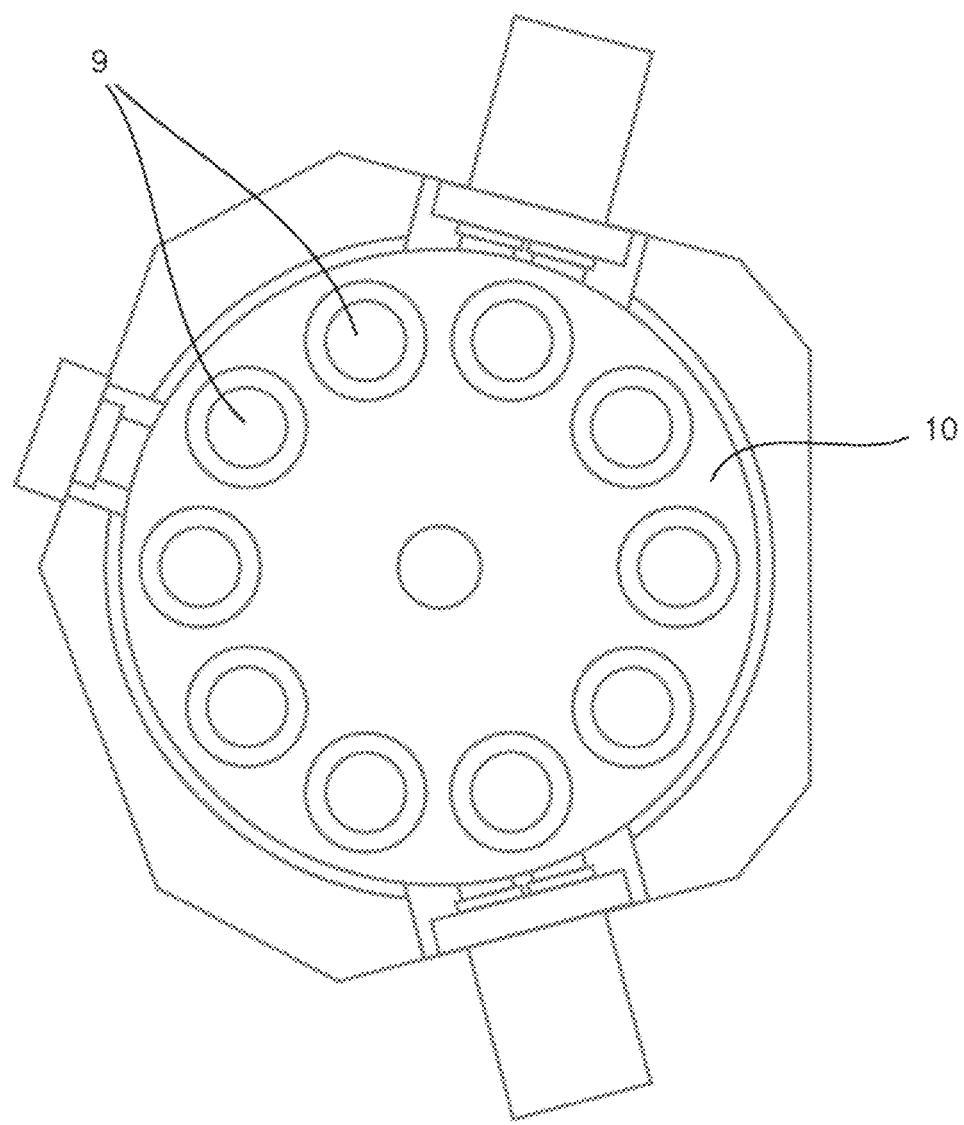
FIG. 2 shows a schematic illustration of a preferred device according to the invention with a rotary table in plan view.

FIG. 2 shows schematically in plan view a preferred embodiment of the rotary table. The rotary table 10 is situated in the device and, in this example, has ten identical substrate mountings 9.

Figure 3:
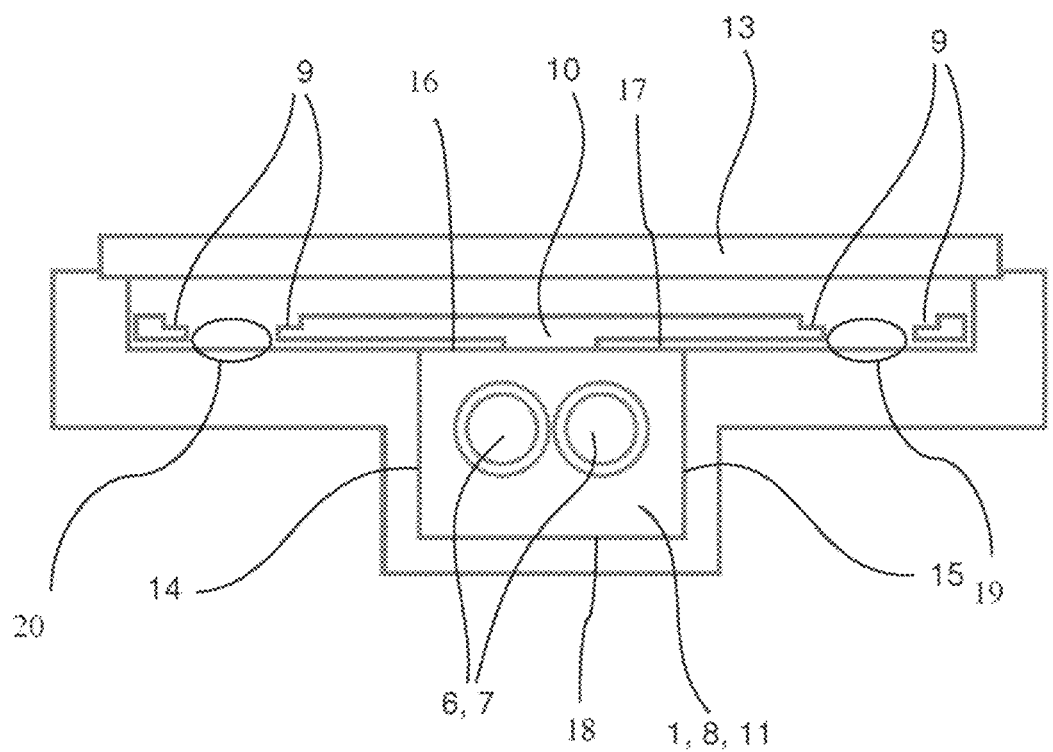
FIG. 3 shows a schematic illustration of a preferred device according to the invention with rotary table in side view.

FIG. 3 shows schematically in side view a preferred embodiment of the device with rotary table 10. The cross-section of a magnetron sputtering device is visible, which device comprises two cylinders made of the source material 6, 7 (double magnetron arrangement). The magnetron sputtering device is delimited in a gas-impermeable manner from the rest of the device at the sides by delimiting walls 14, 15 and at the top by the rotary table 10, includes sputtering gas 11 and is under vacuum 1. Two substrate mountings 9 of the rotary table 10 are illustrated or are visible in the cross-section. Above the rotary table 10, a cover 13 is situated, which cover seals the device in a gas-impermeable manner with delimiting walls which are situated at the side of the rotary table 10.

In a further variant according to the invention, not only are the targets made of the source material but also further components in the sputtering zones. A first variant provides here that the apertures 16, 17, which delimit the magnetron sputtering device at the top to the side of the axis of the rotary table 10, consist of the source material or have a surface made of the source material.

A second variant provides that, in addition to the apertures 16, 17, the entire inner surface of the magnetron sputtering device, these are the delimiting walls 14, 15 and the lower wall 18, consist of the source material or have a surface made of the source material.

A third variant provides that, in addition to the entire inner surface of the magnetron sputtering device, also the surface of the rotary table 10, orientated towards the magnetron sputtering device, has a surface made of the source material.

A further variant provides that, below substrate mountings 9 in the regions 19, 20, respectively a shaper aperture (not illustrated in FIG. 3) is disposed, which mountings are disposed at a small spacing relative to the substrate, e.g. 2 mm.

Figure 4:
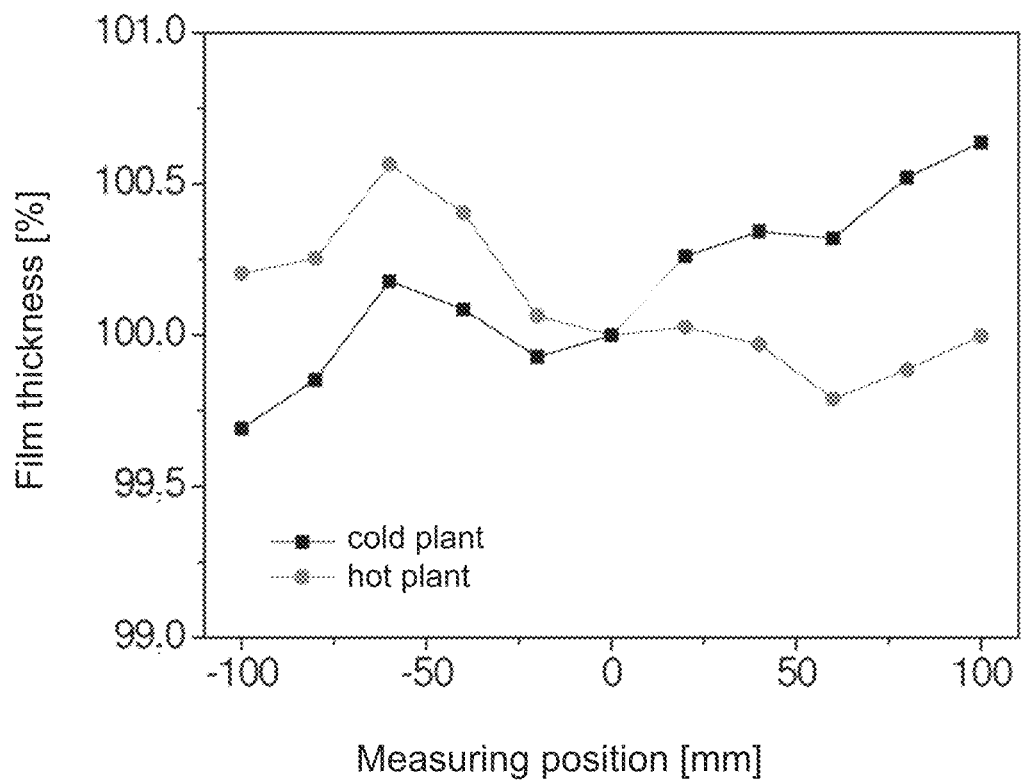
FIG. 4 shows a comparison of the course of the film thicknesses with reference to a diagram.

FIG. 4 shows two graphs which display the course of the film thickness, standardised to the centre of the substrate. Both graphs are plotted at different plant states (warm/cold). Since the temperature influences the getter behaviour and reactive gas was used in these processes, the result is different distributions.

Figure 5:
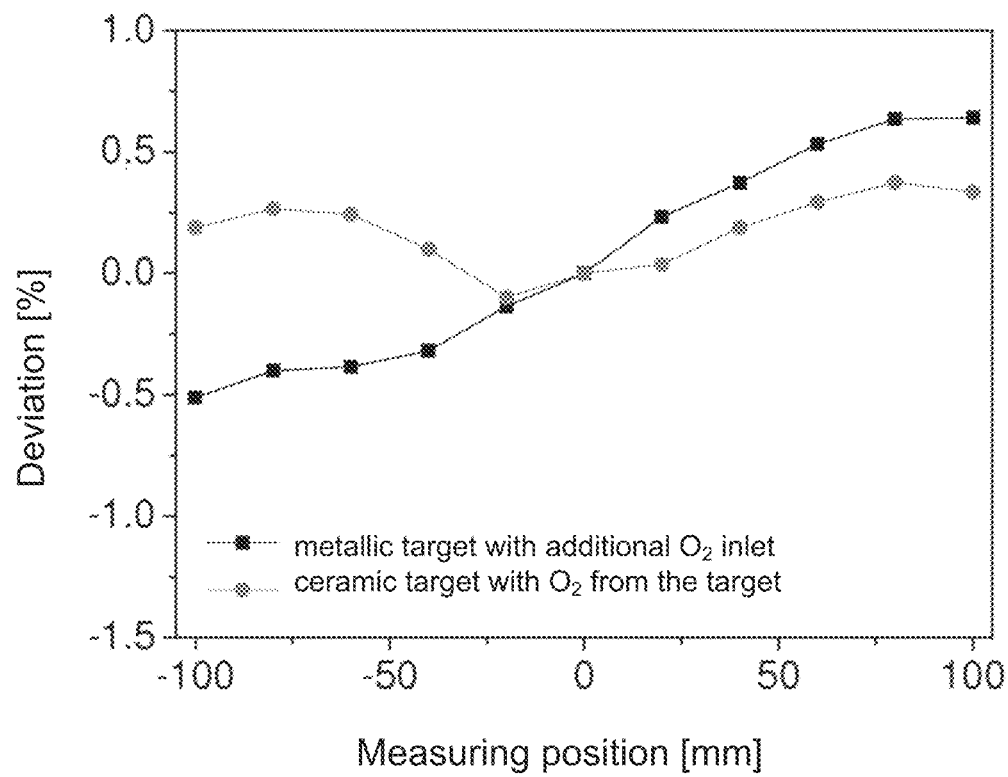
FIG. 5 shows a comparison of the course of the film thicknesses with reference to a diagram.

FIG. 5 shows two graphs which show the deviation of the film thicknesses, standardised to the centre of the substrate. The difference relates to the different plant states, warm and cold. Here, a metallic target is compared with a ceramic target. The deviation of the uniformity can be reduced by more than half.

Figure 6:
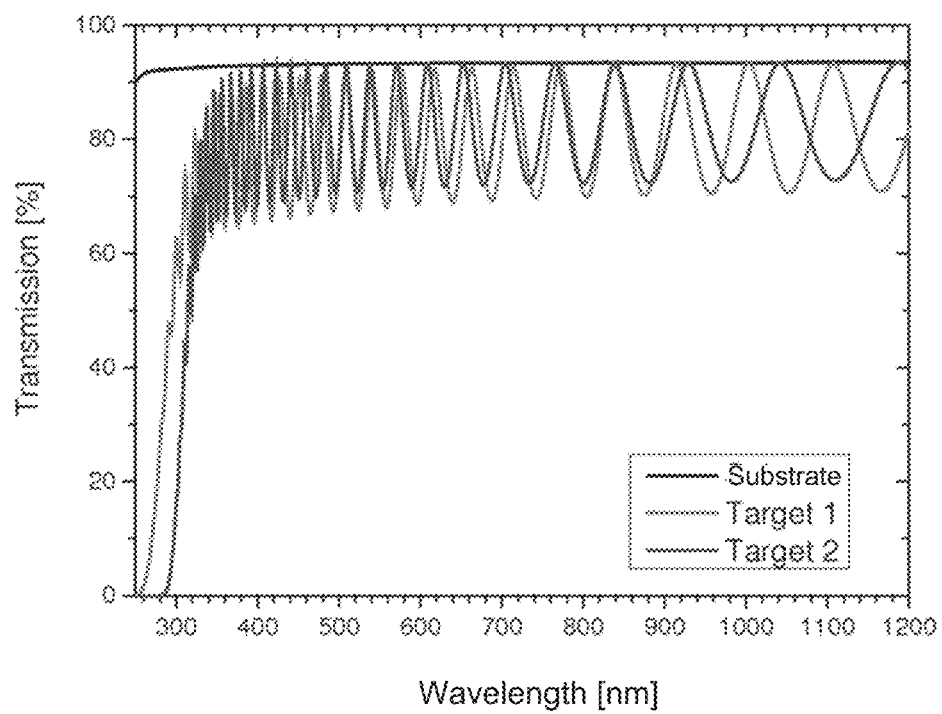
FIG. 6 shows measured transmission films of $Ta_2O_5$ films on quartz of two different target variants.

FIG. 6 shows measured transmission spectra of approx. 2,000 nm thick $Ta_2O_5$ films on quartz of two different target variants. Target 1 is a target with a Ta weight proportion of 30% and a $Ta_2O_5$ weight proportion of 70%, corresponding to a stoichiometry $Ta_2O_{3.3}$. Target 2 concerns a target in the stoichiometry of $Ta_2O_4$. With both targets, with the assistance of an additional subsequent oxidation in the plasma, films with good optical properties can be produced, i.e. low absorption, in the visible spectral range, target 2 having an even higher transmission in the visible range, therefore being better suited for particularly highly demanding optical components. By varying the oxygen content of the plasma source, the transmission here can however also be improved even further. Target 1 has greater transparency in the UV range, which is based on the fact however that dopings, which effect displacement of the strip edge, were used in target 2. Even target 1 has a high transmission and low optical losses in the visible spectral range. The advantage with target 1 is that the rate is greater by 40% with the same power than with the fully stoichiometric target. Since the power, as a result of available power at the generator or else even due to material breakage, cannot be increased randomly, also a production advantage is consequently produced. Relative to a fully stoichiometric target, target 2, in the form $Ta_2O_{3.3}$, also has the advantage of an increased coating rate.

Irrespective of this special embodiment of FIG. 6, it applies that the targets can be produced in various ways. For example sintering processes or also thermal injection moulding are conceivable. The microstructure of the thus produced target materials can hereby be different, in particular the grain size can differ. It is also possible that a structure is formed in which both metallic particles or phases, in addition to oxidic particles or phases, can be found in the target material. The sizes of these structures can be between a few mm and several 100 mm. Even in this case, it is shown that the process stability and also the optical quality is improved. A small grain size or size of the different phases is to be preferred, for particular preference dimensions are of less than 30 mm.

Figure 7:
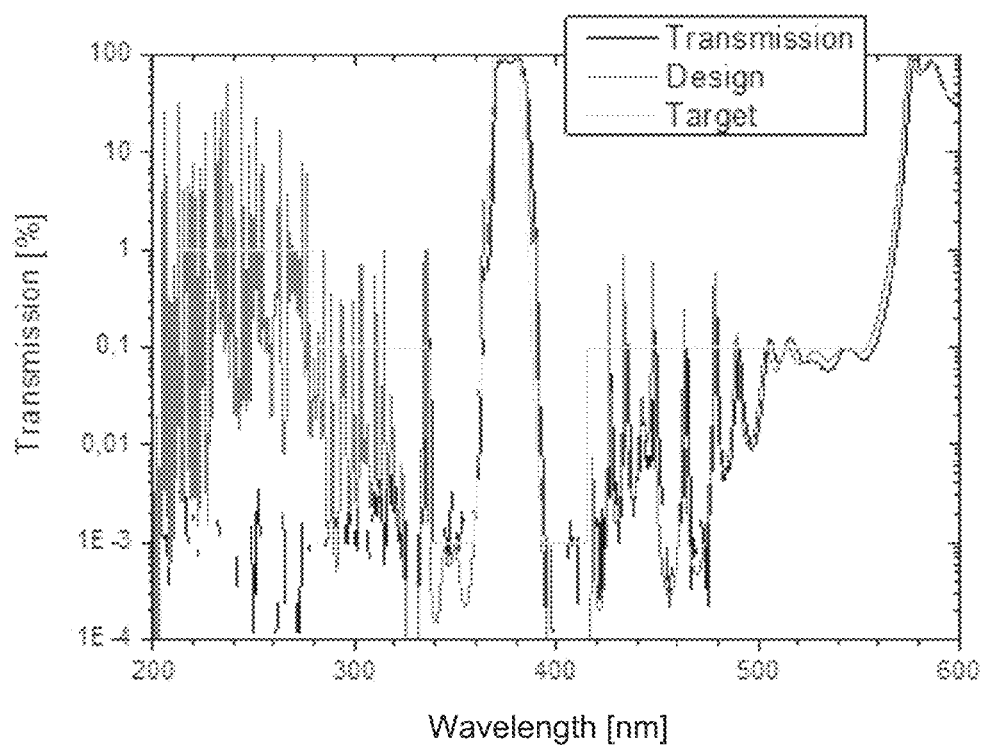
FIG. 7 shows an optical thin-film filter which was produced with one of the two target variants.

FIG. 7 shows an optical filter consisting of a multiple film system made of $SiO_2$ and $Ta_2O_5$ which was produced with a target according to the invention, variant 2. In total 120 films were hereby used with a total thickness of 6 μm. The filter has a narrow transmission range at 375 nm and a deep blocking between 200 and 550 nm. The shorter strip edge, in the case of target 2, is hereby advantageous because better blocking can be achieved below 300 nm, however a higher transmission from 330 nm than with target 1 is achieved at the same time.

The invention claimed is:

1. A method for the production of uniform films on moving substrates in a vacuum chamber by deposition of at least one source material by means of magnetron sputtering in which at least one substrate is transported with at least one movable substrate mounting in the vacuum chamber to at least one sputtering zone and, in the sputtering zone, at least one film made of at least one source material is deposited on the substrate by sputtering the target comprising the at least one source material, wherein the at least one source material when sputtered, decomposes and releases a reactive gas into the vacuum chamber, wherein the at least one source material is $MeO_{2-x}$, $Me_2O_{3-y}$ or $Me_2O_{5-z}$, wherein Me=Zr, Hf, Si, Ta, Y, and/or a mixture thereof, starting from the full stoichiometry, the value of x being between 0.5 and 1.5, the value of y being between 0.5 and 1.5, and the value of z being between 0.5 and 2.5;

wherein all surfaces which are situated in the sputtering zone, including surfaces of apertures which are disposed in the sputtering zone, consist of the at least one source material, wherein, for process control, the thickness of the film on the substrate is controlled by oscillator quartz measurement, wherein the target is cylindrical, wherein, in the vacuum chamber, at least one plasma source is disposed, wherein the at least one plasma source is utilized for cleaning the substrate and utilized in order to oxidise, nitride, and/or fluorinate the film on the substrate, wherein the substrate consists of polycarbonate, polypropylene, polyether ether ketone, polyethylene, polyvinylchloride, polystyrene, polyurethane, or polyethylene terephthalate, wherein the compressive film stress is stable and reproducible in the range of 0-400 MPa, wherein the process pressure in the vacuum chamber is in the range of $3 \cdot 10^{-4}$ to $5 \cdot 10^{-2}$ mbar, and wherein the magnetron sputtering is operated by HIPIMS.

2. The method according to claim 1, wherein the conditioning of the substrate is implemented at a temperature of at most 100° C.

3. The method according to claim 1, wherein the films have a uniformity of at least 99.0%, measured by transmission photometry at a spectral edge of the deposited filter system.

4. The method according to claim 1, wherein the substrate consists of polyether ether ketone, polyvinylchloride, or polyurethane.

5. A device for the production of uniform films on moving substrates in a vacuum by deposition of at least one source material by magnetron sputtering, wherein the device for the production is configured to be operated with a pulsed direct current supply by high-power impulse magnetron sputtering (HIPIMS) and comprises a vacuum chamber with at least one sputtering zone in which at least one magnetron sputtering device with at least one target comprising the at least one source material is disposed, at least one movable substrate mounting for transport of at least one substrate to the at least one sputtering zone being disposed in the vacuum chamber, wherein the at least one source material is a material which, when sputtered, decomposes and releases a reactive gas into the vacuum chamber;

wherein the at least one source material is $MeO_{2-x}$, $Me_2O_{3-y}$ or $Me_2O_{5-z}$, wherein Me=Zr, Hf, Si, Ta, Y, and/or a mixture thereof, starting from the full stoichiometry, the value of x being between 0.5 and 1.5, the value of y being between 0.5 and 1.5, and the value of z being between 0.5 and 2.5;

wherein all surfaces which are situated in the sputtering zone, including surfaces of apertures which are disposed in the sputtering zone, consist of the at least one source material, wherein, in the vacuum chamber, a device for measuring the film thickness of the deposited film on the substrate is provided, wherein the target is cylindrical, wherein, in the vacuum chamber, at least one plasma source is disposed, wherein the at least one plasma source is configured to be utilized for cleaning the substrate and is equipped and adjusted such that it oxidizes, nitrides and/or fluorinates the film on the substrate, wherein the substrate consists of polycarbonate, polypropylene, polyether ether ketone, polyethylene, polyvinylchloride, polystyrene, polyurethane, or polyethylene terephthalate, wherein the device for production is configured to produce a uniform film having a compressive film stress which is stable and reproducible in the range of 0-400 MPa, and wherein the process pressure in the vacuum chamber is in the range of $3 \cdot 10^{-4}$ to $5 \cdot 10^{-2}$ mbar.

6. The device according to claim 5, wherein the reactive gas is selected from the group consisting of oxygen, nitrogen, fluorine, and combinations thereof.

7. The device according to claim 5, wherein the at least one movable substrate mounting is a rotating rotary table with a receiving means for substrate carriers.

8. The device according to claim 5, wherein the substrate consists of polypropylene, polyether ether ketone, polyethylene, polyvinylchloride, or polyurethane.

9. The device according to claim 5, wherein the at least one source material is $MeO_{2-x}$, $Me_2O_{3-y}$ or $Me_2O_{5-z}$, wherein Me=Hf, Si, Ta, Y, and/or a mixture thereof, starting from the full stoichiometry, the value of x being between 0.5 and 1.5, the value of y being between 0.5 and 1.5, and the value of z being between 0.5 and 2.5.

10. The device according to claim 5, wherein the at least one source material is $MeO_{2-x}$, $Me_2O_{3-y}$ or $Me_2O_{5-z}$, wherein Me=Zr, Hf, Ta, Y, and/or a mixture thereof, starting from the full stoichiometry, the value of x being between 0.5 and 1.5, the value of y being between 0.5 and 1.5, and the value of z being between 0.5 and 2.5.

11. The device according to claim 9, wherein the substrate consists of polypropylene, polyether ether ketone, polyethylene, polyvinylchloride, or polyurethane.

12. The device according to claim 10, wherein the substrate consists of polypropylene, polyether ether ketone, polyethylene, polyvinylchloride, or polyurethane.

* * * * *